United States Patent [19]

Kanai et al.

[11] Patent Number: 5,391,232

[45] Date of Patent: Feb. 21, 1995

[54] DEVICE FOR FORMING A DEPOSITED FILM

[75] Inventors: Masahiro Kanai, Tokyo; Masaaki Hirooka, Toride; Junichi Hanna, Yokohama; Isamu Shimizu, Yokohama; Eiji Takeuchi, Yokohama, all of Japan

[73] Assignee: Canon Kabushiki Kaisha, Tokyo, Japan

[21] Appl. No.: 73,976

[22] Filed: Jun. 8, 1993

Related U.S. Application Data

[63] Continuation of Ser. No. 769,163, Oct. 11, 1991, abandoned, which is a continuation of Ser. No. 275,619, Nov. 25, 1988, abandoned, which is a continuation of Ser. No. 945,580, Dec. 23, 1986, abandoned.

[30] Foreign Application Priority Data

Dec. 26, 1985 [JP] Japan .................. 60-292313
Dec. 26, 1985 [JP] Japan .................. 60-294451

[51] Int. Cl.$^6$ .................................................. C23C 16/00
[52] U.S. Cl. ........................................ 118/715; 118/725
[58] Field of Search ............... 118/715, 723 E, 725

[56] References Cited

U.S. PATENT DOCUMENTS

| | | | |
|---|---|---|---|
| Re. 31,708 | 10/1984 | Gordon | 427/126.2 |
| 3,220,880 | 11/1965 | Feuersanger | 118/715 |
| 3,297,501 | 1/1967 | Reisman | 156/613 |
| 3,306,768 | 2/1967 | Peterson | 427/255.3 |
| 3,473,978 | 10/1969 | Jackson et al. | 148/175 |
| 3,888,705 | 6/1975 | Fletcher et al. | 148/175 |
| 4,105,810 | 8/1978 | Yamazaki | 427/255.3 |
| 4,131,659 | 12/1978 | Authier | 264/25 |
| 4,146,657 | 3/1979 | Gordon | 427/126 |
| 4,239,811 | 12/1980 | Kemlage | 427/95 |
| 4,250,428 | 2/1981 | Oliver | 313/268 |
| 4,357,179 | 11/1982 | Adams et al. | 148/1.5 |
| 4,402,762 | 9/1983 | John et al. | 148/1.5 |
| 4,421,592 | 12/1983 | Shuskus | 118/723 |
| 4,446,815 | 5/1984 | Kalbskoph | 148/718 |
| 4,448,801 | 5/1984 | Fukuda et al. | 427/39 |
| 4,462,847 | 7/1984 | Thompson et al. | 148/174 |
| 4,499,853 | 2/1985 | Miller | 118/725 |
| 4,504,518 | 3/1985 | Ovshinsky et al. | 427/38 |
| 4,508,054 | 4/1985 | Baumberger | 118/715 |
| 4,522,663 | 6/1985 | Ovshinsky et al. | 148/403 |
| 4,532,199 | 7/1985 | Ueno et al. | 430/128 |
| 4,554,180 | 11/1985 | Hirooka | 427/248.1 |
| 4,615,905 | 10/1986 | Ovshinsky | 427/39 |
| 4,624,736 | 11/1986 | Gee et al. | 156/643 |
| 4,624,906 | 11/1986 | Kawamura et al. | 430/84 |

(List continued on next page.)

FOREIGN PATENT DOCUMENTS 74212 3/1983 European Pat. Off. .
90586A 10/1983 European Pat. Off. .
59-199035 12/1984 Japan .

(List continued on next page.)

OTHER PUBLICATIONS

Brodsky, IBM TDB vol. 22, No. 8A, Jan. 1980 pp. 3391-3392.
Sakai et al., Proceedings, 6th E.C. Photovoltaic Solar Energy Conference, London, Apr. 15-19, 1985.
Inoue, Appl. Phys. Lett. 43(8), 15 Oct. 83, p. 74.
Ohnishi et al., Proceedings, 6th E.C. Photovoltaic Solar Energy Conference, London, Apr. 15-19, 1985.

*Primary Examiner*—Richard Bueker
*Attorney, Agent, or Firm*—Fitzpatrick, Cella, Harper & Scinto

[57] ABSTRACT

There is described a device for forming a deposited film on a substrate in a vacuum chamber through utilization of reaction between a gasifiable starting material for formation of a deposited film and a gaseous halogenic oxidizing agent having the property of oxidization action for the gasifiable starting material which has a gas introducing means comprising a pipe for introducing said gasifiable starting material and a pipe for introducing said gaseous halogenic oxidizing agent where the pipes are arranged in a multi-concentric structure and at least one of the pipes except the outermost pipe is constituted of a porous pipe or has a hole opened through the wall thereof and the outermost pipe has at least one opening oriented toward the substrate.

26 Claims, 7 Drawing Sheets

U.S. PATENT DOCUMENTS

| | | | |
|---|---|---|---|
| 4,637,938 | 11/1987 | Lee | 427/53.1 |
| 4,645,689 | 2/1987 | Cox | 427/87 |
| 4,652,463 | 3/1987 | Peters | 427/53.1 |
| 4,657,777 | 4/1987 | Hirooka | 427/39 |
| 4,689,093 | 8/1987 | Ishihara et al. | 437/5 |
| 4,751,192 | 6/1988 | Hirooka et al. | 437/4 |

FOREIGN PATENT DOCUMENTS

| | | | |
|---|---|---|---|
| 60-43819 | 8/1985 | Japan . | |
| 60-189928 | 9/1985 | Japan | 118/715 |
| 61-180424 | 8/1986 | Japan | 156/611 |
| 2038086A | 7/1980 | United Kingdom . | |
| 2148328A | 5/1985 | United Kingdom . | |
| 197803 | 3/1978 | U.S.S.R. | 156/613 |

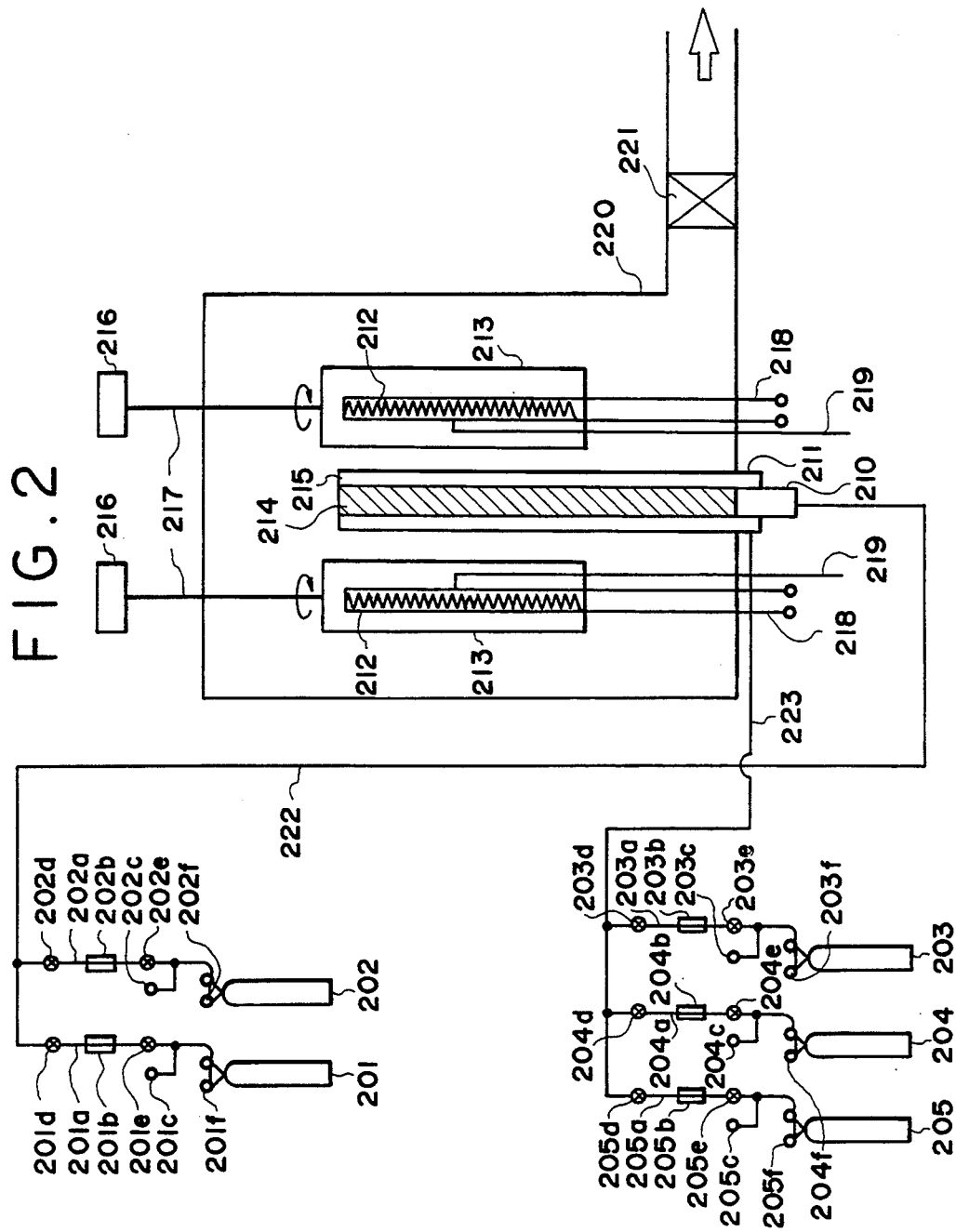

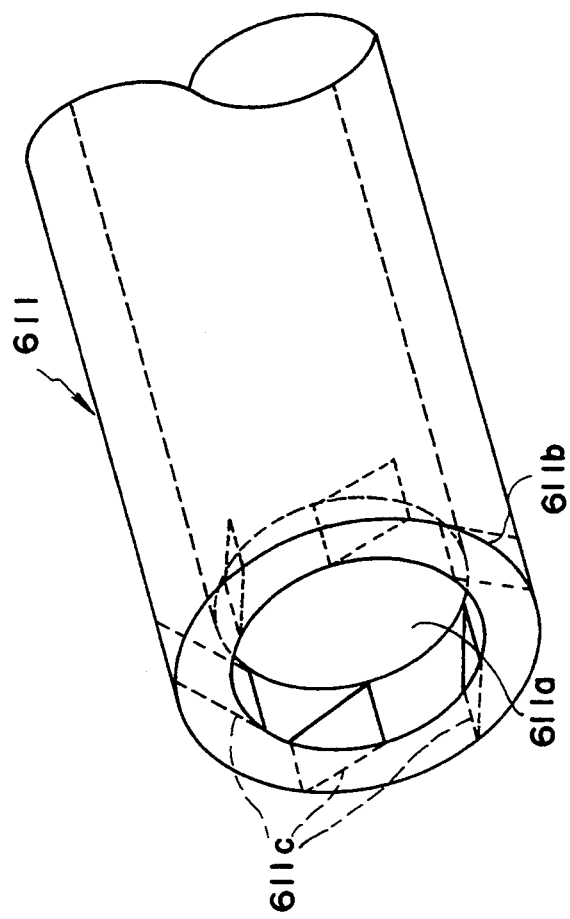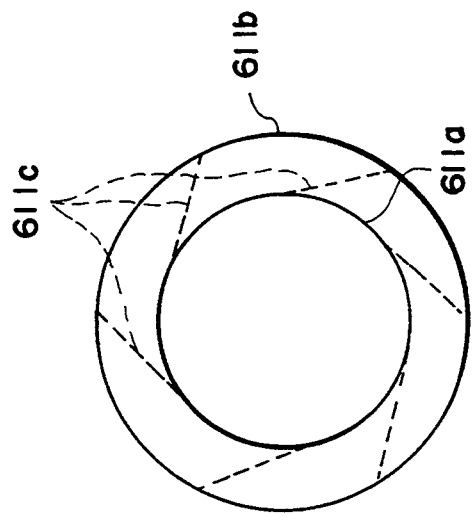

DEVICE FOR FORMING A DEPOSITED FILM

This application is a continuation of application Ser. No. 07/769,163, filed Oct. 11, 1991, now abandoned, which in turn is a continuation of application Ser. No. 07/275,619, filed Nov. 25, 1988, now abandoned, which in turn is a continuation of application Ser. No. 06/945,580, filed Dec. 23, 1986, now abandoned.

BACKGROUND OF THE INVENTION

1. Field of the Invention

This invention relates to a device for forming a deposited film to be used for formation of a functional film, particularly a functional deposited film which is useful for an electronic device such as a semiconductor device, photosensitive device for electrophotography, optical input sensor for optical image inputting device, image pick-up device, photovoltaic device, etc.

2. Related Background Art

In the prior art, for formation of amorphous or polycrystalline functional films such as semi-conductor films, insulating films, photoconductive films, magnetic films, metal films, etc., suitable film forming methods have been individually employed from the standpoint of desired physical characteristics, uses, etc.

For example, for formation of silicon deposited films such as of non-single crystalline silicon including amorphous and polycrystalline silicon which are optionally compensated for lone pair electrons with a compensating agent such as hydrogen atoms (H) or halogen atoms (X), etc., (hereinafter abbreviated as "NON-Si (H,X)" particularly "A-Si (H,X)" when indicating amorphous silicon and "poly-Si (H,X)" when indicating polycrystalline silicon) (the so called microcrystalline silicon is included within the category of A-Si (H,X) as a matter of course), there have been used as an attempt the vacuum vapor deposition method, the plasma CVD method, the thermal CVD method, the reactive sputtering method, the ion plating method, the optical CVD method, etc. Generally, the plasma CVD method has been widely used and industrialized. These methods can also be used for formation of other deposited films.

However, the reaction process in formation of a silicon deposited film according to the plasma CVD method which has been generalized in the prior art is considerably complicated as compared with the CVD method of the prior art, and its reaction mechanism involves not a few ambiguous points. Also, there are a large number of parameters for formation of a deposited film (for example, substrate temperature, flow rates and flow rate ratio of introduced gases, pressure during film formation, high frequency power, electrode structure, structure of reaction vessel, evacuation rate, plasma generating system, etc.). On account of dependence on such a large number of parameters, plasma may sometimes become an unstable state, whereby marked deleterious influences were exerted frequently on a deposited film formed. Besides, parameters specific to individual devices must be selected for each device and therefore under the present situation it is actually difficult to standardize the production conditions.

On the other hand, for silicon deposited films to exhibit sufficiently satisfactory electrical or optical characteristics for respective uses, it is now accepted that the best way to form them is according to the plasma CVD method.

However, depending on the application use of silicon deposited films, bulk production with reproducibility may be required with full satisfaction in terms of enlargement of area, uniformity of film thickness as well as uniformity of film quality, and therefore in formation of such silicon deposited films according to the plasma CVD method, enormous installation investment will be required for a bulk production device and also control items for bulk production will be complicated with a narrow tolerance limit for control and a delicate operating condition of a device. These are pointed out as problems to be improved in future.

Also, in the case of the plasma CVD method, since plasma is directly generated by high frequency or microwave, etc., in a film forming space in which a substrate for film formation is arranged, electrons or a number of ion species generated may cause damage to a film in the film forming process to cause lowering in film quality or non-uniformization of film quality.

For the improvement of this point, the indirect plasma CVD method was proposed.

The indirect plasma CVD method was developed to use selectively effective chemical species for film formation by forming plasma by microwave, etc., at an upstream position apart from a film forming space and transporting said plasma to the film forming space.

However, even in the indirect plasma CVD method, transport of plasma is essentially required and therefore the chemical species effective for film formation must have long life, whereby the gas species which can be employed are spontaneously limited, thus failing to give various deposited films. Also, enormous energy is required for generation of plasma, and generation of the chemical species effective for film formation and their amounts cannot be essentially placed under simple control. Thus, various problems remain to be solved.

As contrasted to, the plasma CVD method, the optical CVD method is advantageous in that no ion species or electrons are generated which give damages to the film quality during film formation. However, there are problems such that light source does not include so much kinds, that the wavelength of light source tends to be toward UV-ray side, that a large scale light source and its power source are required in the case of industrialization, that a window for permitting light from a light source to be introduced into a film forming space is coated with a film during film formation to result in lowering in dose during film formation, which may further lead to shut-down of the light from the light source into the film forming space.

There is proposed recently a new method for forming a deposited film quite different in film forming process from the above-mentioned methods. FIG. 1 illustrates an embodiment of the apparatus realizing such a method for forming a deposited film as a schematic drawing.

The deposited film forming device shown in FIG. 1 is broadly divided into a main body, an evacuation system and a gas feeding system.

In the main body (vacuum chamber), a reaction space and a film forming space are provided.

101–105 are respectively bombs filled with gases to be used during film formation, 101a–105a are respectively gas feeding pipes, 101b–105b are respectively mass flow controllers for controlling the flow rates of gases from the respective bombs, 101c–105c are respectively gas pressure gauges, 101d–105d and 101e–105e are respectively valves, and 101f–105f are respectively pressure gauges indicating the pressures in the corresponding gas bombs.

120 is a vacuum chamber equipped at the upper portion with a means for gas introduction, having a structure for formation of a reaction space downstream of the gas introducing means, and also having a structure for formation of a film forming space in which a substrate holder 112 is provided so that a substrate 118 may be placed as opposed to the gas 10 introducing port of said means. The means for gas introduction has a double concentric arrangement structure, having from the innerside a first gas introducing pipe 109 for introducing gases from the gas bombs 101, 102, and a second gas introducing pipe 110 for introducing gases from the gas bombs 103–105. 111 is the tip end portion of the gas introducing pipes 109 and 110 and constitutes the gas introducing port. The dimension and arrangement of the gas introducing pipes 109 and 110 at the gas introducing port 111 are same as those at the upflow side, that is, they are in a straight double concentric structure. Further, the ends of the gas introducing pipes 109 and 110 are arranged evenly within a single plane. In this case, since the gas introducing port to the reaction space has the above-explained structure, gases from the gas introducing pipes 109 and 110 are individually introduced into the reaction space and then mixed therein.

Gases from the gas bombs are fed to the respective introducing pipes through the gas feeding pipelines 123 and 124, respectively.

The respective gas introducing pipes, the respective gas feeding pipelines and the vacuum chamber 120 are adapted to be evacuated to vacuum through the main vacuum valve 119 by means of an evacuating device not shown.

A substrate 118 is suitably placed at a desired distance from the positions of the respective gas introducing pipes by moving vertically the substrate holder 112.

113 is a heater for heating a substrate which is provided in order to heat a substrate to an appropriate temperature during film formation, or preheating a substrate 118 before film formation, or further to anneal a film after film formation.

The substrate heating heater 113 is supplied with power through a conductive wire 114 from a power source 115.

116 is a thermocouple for measuring the temperature of a substrate (Ts) and is electrically connected to a temperature display device 117.

An example of film forming process with the use of the device for formation of a deposited film shown in FIG. 1 is described below.

At first, after completing the predetermined gas supply procedure, $SiH_4$ gas filled in the bomb 101 and $F_2$ gas diluted to 5% with He gas (referred to $F_2$ (5)/He gas) are introduced to the reaction space at the gas blowing port 111 through the gas introducing pipes 109 and 110 respectively. $SiH_4$ gas and $F_2$ (5)/He gas introduced into the reaction space are therein mixed with each other and chemical reaction is caused by the oxidization action of $F_2$ gas. A substrate 118 is then exposed to the atmosphere where the chemical reaction is in progress and an Si:H:F film is thereby formed on the substrate 118.

As above, a deposited film forming process using the device for forming a deposited film shown in FIG. 1 has the advantage that only mixing in the reaction space of gases suitably selected and used as desired enables film formation. The device shown in FIG. 1 is not so complicated and expensive as devices used in e.g. the PCVD process. Further, the film suffers from no ion damage or particle damage and thus a film of high quality can be formed.

The deposited film forming process described above is very simple while the gas mixing technique in the reaction space is an important parameter which decides the quality of a film formed.

As described above, in formation of silicon deposited film, points to be solved still remain, and it has been earnestly desired to develop a method for forming a deposited film which is capable of bulk production with conservation of energy by the use of a device of low cost, while maintaining the practically utilizable characteristics and the uniformity. These are in common with the cases of other functional films such as silicon nitride films, silicon carbide films, silicon oxide films for the similar problems which should be solved respectively.

SUMMARY OF THE INVENTION

An object of the present invention is to remove the drawbacks of the method for forming deposited films as described above and at the same time to provide a novel device for forming a deposited film without the use of the formation method of the prior art.

Another object of the present invention is to effect conservation of energy and at the same time to provide a device for forming a deposited film adapted to obtaining a deposited film with uniform characteristics over a large area with easy control of film quality.

Still another object of the present invention is to provide a device for forming a deposited film by which a film excellent in productivity and bulk productivity, having high quality as well as excellent physical characteristics such as electrical, optical and semiconductor characteristics can be easily obtained.

Further object of the present invention is to provide a deposited film forming device adapted for forming a high quality deposited film to be used for photovoltaic device, semiconductor device, linesensor for image imput, image pick-up device, photosensitive device for electrophotography, etc.

Still further object of the present invention is to provide a deposited film forming device adapted for forming a uniform, homogeneous and improved deposited film having substantially constantly stable electrical, optical and photoconductive characteristics without depending on most use environments, having excellent light resistance and fatigue characteristics leading to no deterioration phenomenon even in repeated use and having excellent durability and humidity resistance leading to no problem of residual potential.

Another object of the present invention is to provide a device for forming a deposited film which can enhance the utilization efficiency of the starting gases employed, while effecting improvement of various characteristics of film formed, film forming speed and reproducibility as well as uniformization and homogenization of film quality.

According to an aspect of the present invention, there is provided a device for introducing a gasifiable starting material for formation of a deposited film and a gaseous halogenic oxidizing agent having the property of oxidation action for said starting material into a reaction space to effect chemical contact therebetween to thereby form a plural number of precursors containing a precursor under excited state and form a deposited film on a substrate existing in a film forming space with the use of at least one precursor of those precursors as a feeding source for the constituent element of the deposited film, wherein the pipe for introducing said gasifiable starting material into the reaction space and the pipe for introducing said gaseous halogenic oxidizing agent into the reaction space are arranged in a multiconcentric structure, and at least one of said introducing pipes except the outermost pipe is constituted of a porous pipe and an outermost pipe has at least one opening orientated toward the substrate.

According to another aspect of the present invention, there is provided a device for introducing a gaseous starting material for formation of a deposited film and a gaseous halogenic oxidizing agent having the property of oxidation action for said starting material into a reaction space to thereby form chemically a deposited film, which comprises a gas introducing means having a coaxial cylindrical structure comprising a pipe for releasing the gaseous starting material for formation of a deposited film and a pipe for introducing gaseous halogenic oxidizing agent having the property of oxidation action for said starting material, the inner pipe having a hole opened through the wall thereof.

BRIEF DESCRIPTION OF THE DRAWINGS

FIG. 2 is a schematic illustration of a first preferred embodiment of the device for forming a deposited film of the present invention.

FIGS. 5 to 7B are schematic illustrations of the characteristic portion of the device shown in FIG. 4 and of modified embodiments thereof.

DESCRIPTION OF THE PREFERRED EMBODIMENT

Figure 1:
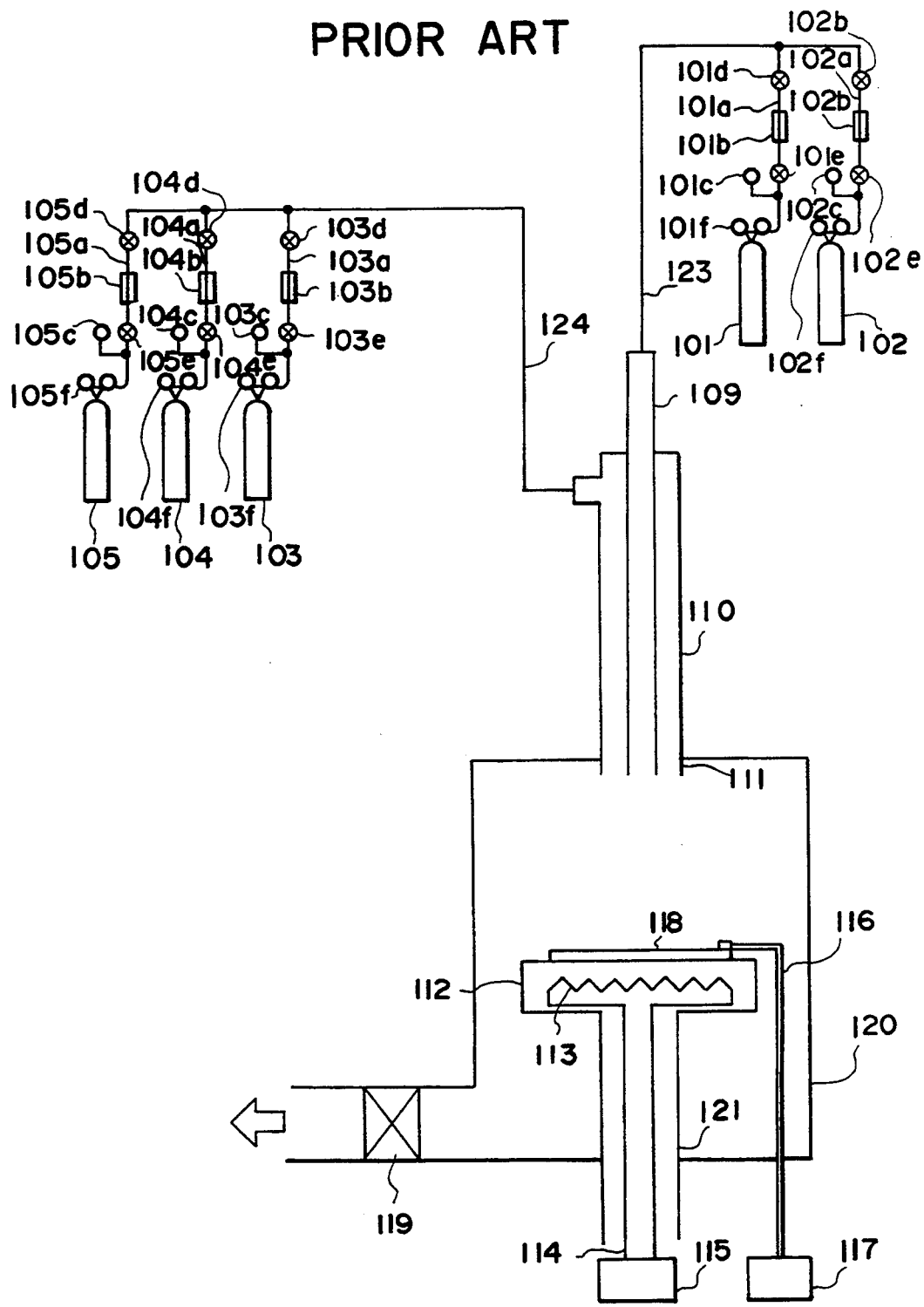
FIG. 1 is a schematic illustration of a deposited film forming device of the prior art regarding the present invention.

The device for forming a deposited film of the present invention is described in detail by referring to the drawings, by which the device for forming a deposited film of the present invention is not limited.

The deposited film forming device shown in FIG. 2 as a preferred embodiment is broadly divided into a main body (vacuum chamber), an evacuation system and a gas feeding system.

In the main body, a reaction space and a film forming space are provided.

201–205 are respectively bombs filled with gases to be used during film formation, 201a–205a are respectively gas feeding pipes, 201b–205b are respectively mass flow controllers for controlling the flow rates of gases from the respective bombs, 201c–205c are respectively gas pressure gauges, 201d–205d and 201e–205e are respectively valves, and 201f–205f are respectively pressure gauges indicating the pressures in the corresponding gas bombs.

220 is a vacuum chamber equipped at the lower portion with a means for gas introduction, having a first gas introducing pipe 210 for introducing gases from the gas bombs 201 and 202 and a second gas introducing pipe 211 for introducing gases from the gas bombs 203 to 205, and being connected to a porous pipe 214 made of aluminum with an opening ratio of 50% and an outer pipe 215 having a slit-shaped opening.

Gases from the repective bombs are fed into the respective gas introducing pipes through the gas feeding pipelines 222, 223, respectively.

Figure 3A:
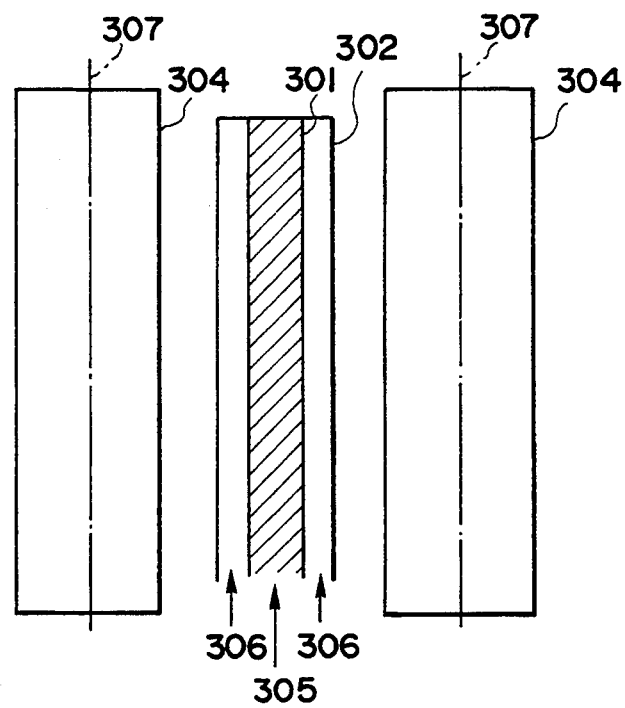
FIGS. 3A and 3B are schematic illustrations of the characteristic portion of the device shown in FIG. 2.
Figure 3B:
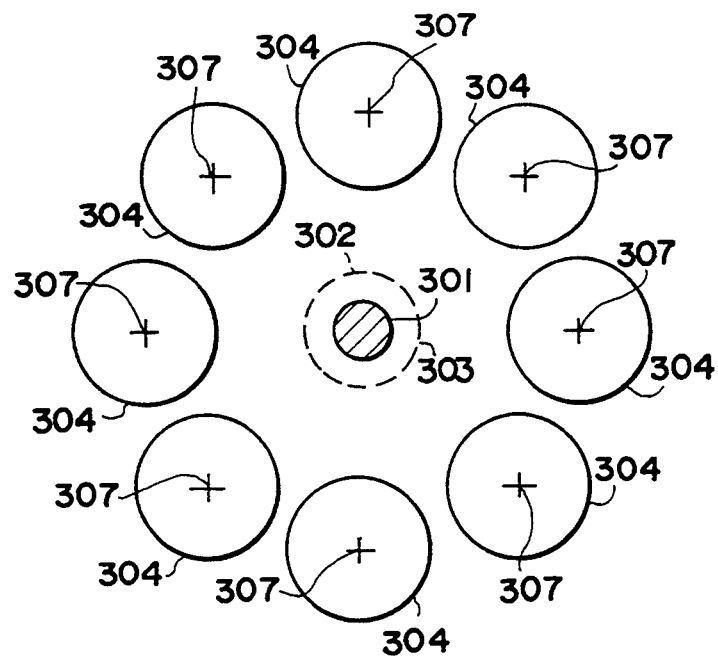

The gas introducing pipes and the cylindrical substrate are arranged as shown in e.g. FIG. 3B.

The substrate 213 is rotated by means of a driving means 216 through the rotatory shaft 217.

The respective gas introducing pipes, the respective gas feeding pipelines and the vacuum chamber 220 are evacuated to vacuum through the main vacuum valve 221 by means of a vacuum evacuating device not shown.

In the case of the present invention, the distance between the substrate and the gas discharging outlet of the gas introducing pipe may be determined appropriately in view of the kinds and the desired characteristics of the deposited film formed, gas flow rates, inner pressure of the vacuum chamber, etc., but it is preferably several mm to 20 cm, more preferably 5 mm to about 15 cm.

212 is a heater for heating the substrate which is provided in order to heat the substrate 213 to an appropriate temperature during film formation, or preheating the substrate 213 before film formation, or further to anneal the film after film formation.

The substrate heating heater 212 is supplied with power through a conductive wire 218.

219 is a thermocouple for measuring the temperature of the substrate (Ts).

For enhancing the reaction efficiency and utilization efficiency of the gases in the present invention, in addition to the film forming factors such as flow rates of the starting material and the halogenic oxidizing agent, pressure in the reaction space, etc., the shape of the gas introducing pipe is an important factor.

An example of the gas introducing pipe of the device shown in FIG. 2 is described below by referring to FIGS. 3A and 3B. FIG. 3A is a side view of the gas introducing pipe and cylindrical substrates being arranged, and FIG. 3B is the top view of them. Substrates 304 are rotatable around the rotatory shaft 307.

In the gas introducing pipe having the structure shown in FIGS. 3A and 3B, if the structure is made to have a porous pipe 301 made of aluminum on the innerside, an outer pipe 302 made of aluminum on the outside and an opening 303, the diameter of the inner pipe should preferably be made 0.1 to 50 mm, more preferably 0.2 to 30 mm, optimally 0.3 to 20 mm. Similarly, the diameter of the outer pipe should preferably be made 0.2 to 60 mm, more preferably 0.3 to 40 mm, optimally 0.4 to 30 mm. The opening ratio of the porous pipe relative to surface area should preferably be 10% or more, more preferably 20% or more, optimally 30% or more.

The opening 303 provided at the outer pipe has a circular, ellipsoidal, polygonal or slit shape, and is opened to the direction in which at least one substrate is arranged or the same porous pipe used as the inner pipe may be used. The opening ratio of the opening relative to surface area may be made preferably 10% or more, more preferably 20% or more, optimally 30% or more.

The length of the gas introducing pipe may be defined depending on the desired length of the substrate, but it is not particularly limited It is desirable that the substrate 304 be disposed so as to occupy the space around the gas introducing pipes 301 and 302, for example, so that the shape formed by linking the rotatory shafts 307 may become a polygon, preferably a regular polygon.

The introducing pipe for the above-mentioned porous pipe and outer pipe may be constituted of, for example, metal materials, ceramic materials, resin materials, composite materials, etc.

Figure 4:
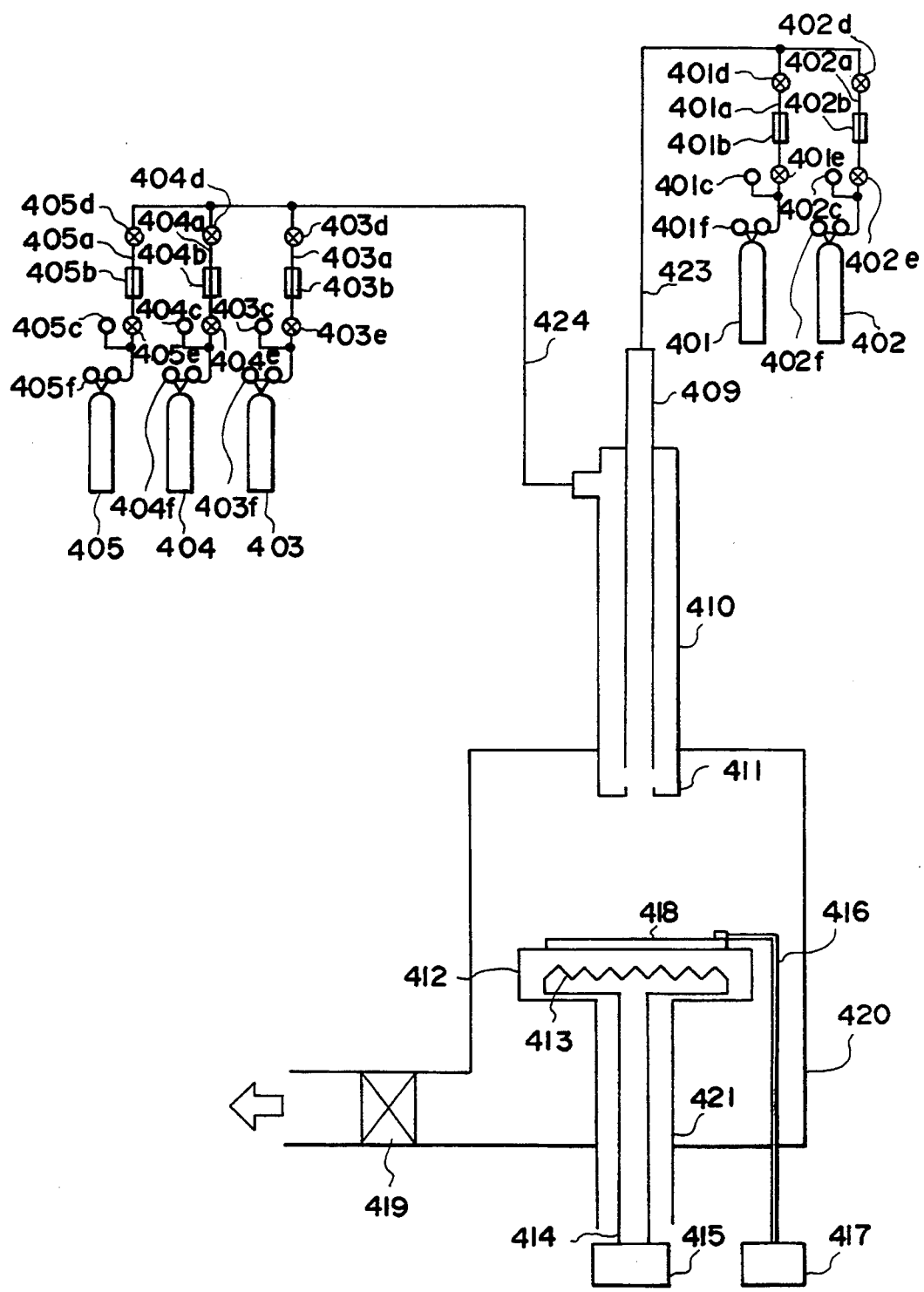
FIG. 4 is a schematic illustration of a second preferred embodiment of the device for forming a deposited film of the present invention.

FIG. 4 shows another preferred embodiment of the device for forming a deposited film of the present invention.

The deposited film forming device shown in FIG. 4 is broadly divided into a main body, an evacuation system and a gas feeding system.

In the main body, a reaction space and a film forming space are provided.

401–405 are respectively bombs filled with gases to be used during film formation, 401a–405a are respectively gas feeding pipes, 401b–405b are respectively mass flow controllers for controlling the flow rates of gases from the respective bombs, 401c–405c are respectively gas pressure gauges, 401d–405d and 401e–405e are respectively valves, and 401f–405f are respectively pressure gauges indicating the pressures in the corresponding gas bombs.

420 is a vacuum chamber equipped at the upper portion with a means for gas introduction, having a structure for formation of a reaction space downstream of the means, and also having a structure for formation of a film forming space in which a substrate holder 412 is provided so that a substrate 418 may be placed as opposed to the gas introducing port of said means. The means for gas introduction has a double concentric arrangement structure, having from the innerside a first gas introducing pipe 409 for introducing gases from the gas bombs 401, 402, and a second gas introducing pipe 410 for introducing gases from the gas bombs 403–405.

Gases from the gas bombs are fed to the respective introducing pipes through the gas feeding pipelines 423 and 424, respectively. 411 is a gas introducing port connected to the gas introducing pipes 409 and 410.

The respective gas introducing pipes, the respective gas feeding pipelines and the film forming space 420 are evacuated to vacuum through a main vacuum valve 419 by means of an evacuating device not shown.

The substrate 418 is suitably set at a desired distance from the positions or the respective gas introducing pipes by moving vertically the substrate holder 412.

413 is a heater for heating a substrate which is provided in order to heat a substrate 418 to an appropriate temperature during film formation, or preheating a substrate 418 before film formation, or further to anneal a film after film formation.

The substrate heating heater 413 is supplied with power through a conductive wire 414 from a power source 415.

416 is a thermocouple for measuring the temperature of a substrate (Ts) and is electrically connected to a temperature display device 417.

Figure 5:
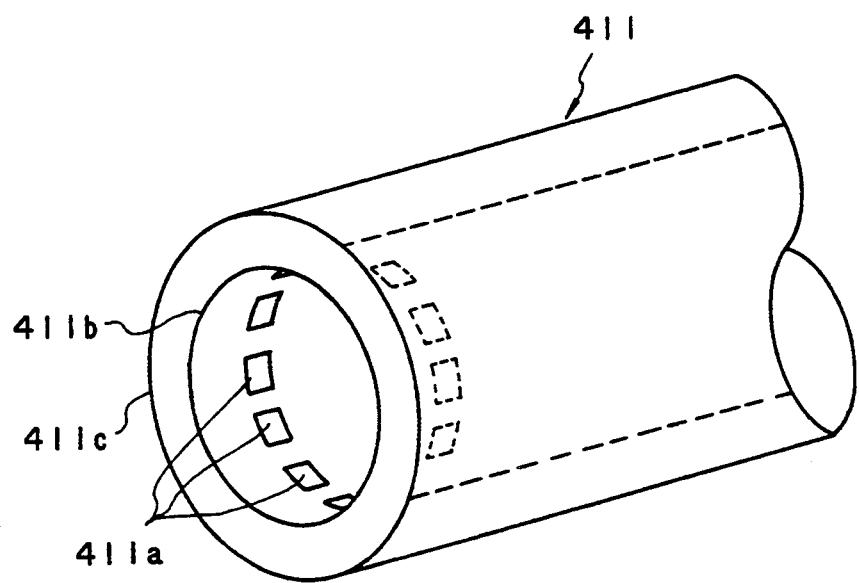

FIG. 5 illustrates the gas introducing port 411 in FIG. 4 in more detail. Said gas introducing port 511 consists of an inner pipe 511b having a hole 511a connected to said gas introducing pipe 409 and an outer pipe 511c.

That is, gas introduced through the gas introducing pipe 410 into the space sandwiched between the inner pipe 511b and the outer pipe 511c of the gas introducing port 511 is changed in its direction toward the center of said inner pipe 511b by passing through the hole 511a provided through said inner pipewall 511b and mixed uniformly and efficiently with the gas introduced through the gas introducing pipe 409 into the inner space of the inner pipe 511b of the gas introducing port 511 primary within the inner space of said gas introducing port.

In the present invention, the material of the gas introducing pipe may be, when it is a metal, stainless steel, Al, Cr, Mo, Au, Pt, Nb, Ta, V, Ti, Fi, Pd, Ni—Cr, or when it is a resin, polyesters, polyethylene, polycarbonate, cellulose acetate, polypropylene, polyvinyl chloride, polyvinylidene chloride, polystyrene, polyamides, etc., or, when it is a ceramic, $Al_2O_3$, $SiO_2$, BeO, MgO, $ZrO_2$, SiC, TiC, ZrC, BN, AlN, $Si_3N_4$, etc. Preferably, Al and stainless steel may be employed from the standpoint of machining adaptability and corrosion resistance.

The gas introducing means to be used in the present invention is arranged in a plural number in the film forming space for the purpose of improving efficiency of film formation, and it can be also accomplished by arranging the substrates so as to surround these gas introducing means.

On introducing gases into the gas introducing means with a multi-concentric structure to be used in the present invention, the film quality obtained will not substantially be changed even if the gases introduced into the inner pipe and the outer pipe may be exchanged with each other.

Such a device of the present invention is free from the change of occurrence of discharging in the film forming space, namely in the reaction chamber, and therefore, the deposited film formed will receive no inconvenient influence from ion damage or other actions such as abnormal discharging, etc.

And, according to the deposited film forming device of the present invention, while enlarged area, uniformness of film thickness and uniformness of film quality can be fully satisfied simultaneously with energy saving to effect simplification of control and bulk production, without requiring enormous installation investment for bulk production equipment, also the control items for bulk production are simple, with the tolerance limit of control being broader and the control of device easier.

In the device for forming deposited film of the present invention, the gasifiable starting material to be used for formation of deposited film receives oxidation action through contact with the gaseous halogenic oxidizing agent, and thus is selected suitably depending on the kind, characteristics and use of the desired deposited film. In the present invention, the above gasifiable starting material and the gaseous halogenic oxidizing agent may be those which can be made gaseous when introduced to be contacted with the gasifiable starting material, and they may be gaseous, liquid or solid under ordinary state.

When the starting material for formation of a deposited film or the halogenic oxidizing agent is liquid or solid, the starting material for formation of a deposited film and the halogenic oxidizing agent are introduced in gaseous state into the reaction space through performing bubbling with the use of carrier gas such as Ar, He, $N_2$, $H_2$, etc., optionally with application of heat.

During this operation, the partial pressures and mixing ratio of the above gaseous starting material and the gaseous halogenic oxidizing agent may be set by controlling the flow rate of the carrier gas and the vapor pressures of the starting material for formation of the deposited film and the gaseous halogenic oxidizing agent.

As the starting material for formation of a deposited film to be used in the present invention, for example, if tetrahedral type deposited films such as semiconductive or electrically insulating silicon deposited films or germanium deposited films, etc., are desired to be obtained, straight or branched chain silane compounds, cyclic silane compounds, chain germanium compounds, etc., may be employed as effective ones.

Specifically, straight chain silane compounds may include $Si_nH_{2n+2}$ (n=1, 2, 3, 4, 5, 6, 7, 8), branched chain silane compounds $SiH_3SiH(SiH_3)SiH_2SiH_3$, cyclic silane compounds $Si_nH_{2n}$ (n=3, 4, 5, 6) and chain germanium compounds $Ge_mH_{2m+2}$ (m=1, 2, 3, 4, 5), etc. Otherwise, if a deposited film of tin is to be prepared, hydrogenated tin such as $SnH_4$, etc. may be employed as a effective starting material.

Of course, these starting materials can be used not only singly but also as a mixture of two or more kinds.

The halogenic oxidizing agent to be used in the present invention is gaseous when introduced into the reaction space and at the same time has the property of effectively oxidizing the gaseous starting material for formation of a deposited film introduced into the reaction space by mere contact therewith, including halogen gases such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the gas of the starting material for formation of a deposited film as described above with desired flow rate and feeding pressure being given, wherein they are mixed with and collided against the above starting material to be chemically contacted therewith, thereby oxidizing the above starting material to generate efficiently a plural kinds of precursors containing precursors in an excited state. Of the precursors in an excited state and other precursors generated, at least one of them functions as a feeding source for the constituent element of the deposited film formed.

The precursors generated may undergo decomposition or reaction to be converted to other precursors in an excited state or to precursors in an another excited state, or alternatively stand unchanged in their original forms although, if desired, releasing energy to contact the substrate surface placed in a film forming space, whereby a deposited film with a three-dimensional network structure is formed when the substrate surface temperature is relatively lower, or a crystalline deposited film is formed when the substrate surface temperature is relatively higher.

In the present invention, so that the deposit film forming process may proceed smoothly to form a film of high quality and having desired physical characteristics, as the film forming factors, the kinds and combination of the starting material and the halogenic oxidizing agent, mixing ratio of the starting material and oxidizing agent, pressure during mixing, flow rate, the inner pressure of the film forming space, the flow types of gases, and the film forming temperature (substrate temperature and atmosphere temperature) are suitably selected as desired. These film forming factors are interrelated to each other, and they are not determined individually but determined respectively under mutual relationships. In the present invention, the ratio of the gaseous starting material for formation of a deposited film and the gaseous halogenic oxidizing agent introduced into the reaction space may be determined suitably as desired in relationship of related film forming factors among the film forming factors as mentioned above, but it is preferably 1/20 to 100/1, more preferably 1/50 to 50/1 in terms of flow rate ratio introduced.

The pressure during mixing when introduced into the reaction space may be preferably higher in order to enhance the probability of the chemical contact between the above gaseous starting material and the above gaseous halogenic oxidizing agent, but it is better to determine the optimum value suitably as desired in view of the reactivity. Although the pressure during mixing may be determined as described above, each pressure during introduction may be preferably $1\times10^{-7}$ atm to 5 atm, more preferably $1\times10^{-6}$ atm to 2 atm.

The pressure within the film forming space, namely the pressure in the space in which the substrate for film formation is arranged may be set suitably as desired so that precursors (E) in an excited state generated in the reaction space and sometimes precursors (D) formed as secondary products from precursors (E) may contribute effectively to film formation.

The inner pressure of the film forming space, when the film forming space is continuous openly to the reaction space, can be controlled in relationship with the introduction pressures and flow rates of the gaseous starting material for formation of a deposited film and the gaseous halogenic oxidizing agent in the reaction space, for example, by application of a contrivance such as differential evacuation or use of a large scale evacuating device.

Alternatively, when the conductance at the connecting portion between the reaction space and the film forming space is small, the pressure in the film forming space can be controlled by providing an appropriate evacuating device in the film forming space and controlling the evacuation rate of said device.

On the other hand, when the reaction space and the film forming space is integrally made and the reaction position and the film forming position are only different in space, it is possible to effect differential evacuation or provide a large scale evacuating device having a sufficient evacuating capacity as described above.

As described above, the pressure in the film forming space may be determined in the relationship with the pressures of the gaseous starting material and the gaseous halogenic oxidizing agent being introduced into the reaction space, but it is preferably 0.001 Torr to 100 Torr, more preferably 0.01 Torr to 30 Torr, optimally 0.05 to 10 Torr.

Substrate temperature (Ts) during film formation can be set suitably as desired individually depending on the gas species employed and the kinds and required characteristics of the deposited film formed, but, in the case of obtaining an amorphous film, it is preferably from room temperature to 450° C., more preferably from 50° to 400° C. Particularly, in the case of forming a crystalline deposited film with better semiconductor characteristics and photoconductive characteristics, etc., the substrate temperature (Ts) should desirably be made 300° to 700° C.

Atmosphere temperature (Tat) in the film forming space may be determined suitably as desired in relationship with the substrate temperature (Ts) so that the above precursors (E) generated and the above precursors (D) are not changed to unsuitable chemical species for film formation, and also the above precursors (E) may be efficiently generated.

The substrate to be used in the present invention may be either electroconductive or electrically insulating, provided that it is selected as desired depending on the use of the deposited film formed. As electroconductive substrates, there may be mentioned metals such as NiCr, stainless steel, Al, Cr, Mo, Au, Ir, Nb, Ta, V, Ti, Pt, Pd, etc., or alloys thereof. As insulating substrate, there may be conventionally used films or sheets of synthetic resins, including polyesters, polyethylene, polycarbonate, cellulose acetate, polypropylene, polyvinyl chloride, polyvinylidene chloride, polystyrene, polyamides, etc., glass, ceramics and so on. At least one side surface of these substrates is preferably subjected to treatment for imparting electroconductivity, and it is desirable to provide other layers on the side at which said electroconductive treatment has been applied.

For example, electroconductive treatment of a glass substrate can be effected by providing a thin film of NiCr, Al, Cr, Mo, Au, Ir, Nb, Ta, V, Ti, Pt, Pd, $In_2O_3$, $SiO_2$, ITO ($In_2O_3+SnO_2$), etc., thereon. Alternatively, a synthetic resin film such as polyester film can be subjected to electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with such a metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion between both is great, a large amount of strains may be created within a film to give sometimes no film of good quality, and therefore it is preferable to use a substrate so that the difference in thermal expansion between both is small.

Also, the surface state of the substrate is directly related to the structure of the film (orientation) or generation of or a stylet structures, and therefore it is desirable to treat the surface of the substrate to give a film structure and a film texture so that desired characteristics may be obtained.

The substrate may be given a motion such as rotation, vibration, etc. in the film forming space, in addition to the use of the gas introducing means according to the present invention, in order to increase uniformity of film quality and film thickness, etc.

The present invention is described in more detail by referring to the following Examples.

EXAMPLE 1

By use of the film forming device shown in FIG. 2, a deposited film was prepared according to the process of the present invention as described below.

$SiH_4$ gas filled in the bomb 201 was introduced at a flow rate of 150 sccm through the gas introducing pipe 210 from the porous pipe 214, $F_2$ gas filled in the bomb 203 at a flow rate of 100 sccm and the He gas filled in the bomb 204 at a flow rate of 200 sccm through the gas introducing pipe 211 from the outer pipe 215 having a slit-shaped opening into the vacuum chamber 220.

During this operation, the pressure in the vacuum chamber 220 was made 0.9 Torr by controlling the opening of the vacuum valve 221. Eight cylindrical substrates made of quartz glass ($\phi$80 mm×250 mm) were used, and the distance between the gas discharging outlet 215 and the substrate was set at 3 cm. Bluish white luminescence was strongly observed in the mixing region of $SiH_4$ gas and $F_2$ gas. The substrate temperature (Ts) was set at 250° C. When the gases were flowed under this state for three hours, Si:H:F films with thicknesses as shown in Table 1 was deposited on the substrate.

The distribution irregularity of the film thickness was within ±0.5% in both longitudinal and lateral directions for all of the eight films. The characteristics were also substantially uniform over the whole surface. Every sample of the Si:H:F film formed was confirmed to be amorphous by electron beam diffraction.

On the amorphous Si:H:F film of each sample, a comb-shaped electrode (gap length 200 $\mu$m) of aluminum was vapor deposited to prepare a sample for measurement of electroconductivity. Each sample was placed in a vacuum cryostat, a voltage of 100 V was applied and the current was measured by a microamperemeter (YHP4140B: manufactured by YOKOKAWA HEWLETT-PACKARD Company) determine the dark electroconductivity ($\sigma$d). Also, light of 600 nm and 0.3 mw/cm² was irradiated to determine the photoconductivity ($\sigma$p). Further, preparing a sample separately, the optical band gap (Eg opt) was determined. These results are shown in Table 1.

The utilization efficiency of gas was about 70%.

TABLE 1

| Sample No. | 1 | 2 | 3 | 4 | 5 | 6 | 7 | 8 |
|---|---|---|---|---|---|---|---|---|
| Film thickness ($\mu$m) | 16.5 | 16.3 | 16.8 | 16.1 | 16.2 | 16.5 | 16.8 | 16.4 |
| Film thickness irregularity (%) | <±4 | <±4 | <±3 | <±3 | <±4 | <±5 | <±4 | <±4 |
| Substrate temperature (°C.) | 250 | 250 | 250 | 250 | 250 | 250 | 250 | 250 |
| Eg opt | 1.67 | 1.68 | 1.67 | 1.67 | 1.68 | 1.67 | 1.68 | 1.68 |
| $\sigma$d (s/cm) | $4.5 \times 10^{-11}$ | $4.7 \times 10^{-11}$ | $4.5 \times 10^{-11}$ | $4.3 \times 10^{-11}$ | $4.8 \times 10^{-11}$ | $4.4 \times 10^{-11}$ | $4.5 \times 10^{-11}$ | $4.7 \times 10^{-11}$ |
| $\sigma$p (s/cm) | $3.3 \times 10^{-6}$ | $3.4 \times 10^{-6}$ | $3.4 \times 10^{-6}$ | $3.5 \times 10^{-6}$ | $3.2 \times 10^{-6}$ | $3.3 \times 10^{-6}$ | $3.5 \times 10^{-6}$ | $3.4 \times 10^{-6}$ |

EXAMPLE 3

Figure 8:
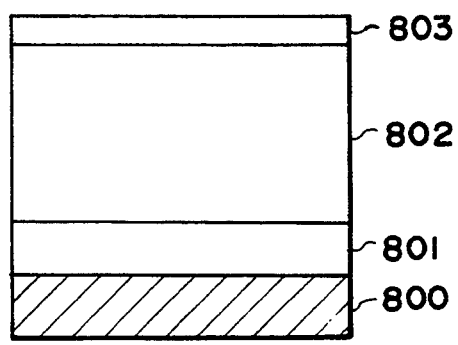
FIG. 8 is a schematic illustration of an example of the image forming member for electrophotography fabricated by the use of the device of the present invention.

By means of the film forming device shown in FIG. 2, an image forming member for electrophotography having the layer constitution shown in FIG. 8 was prepared on an aluminum cylinder substrate under the conditions shown in Table 2.

The $SiH_4$ bomb 201 was replaced with an $Si_2H_6$ bomb. Eight aluminum cylinders with a diameter of 80 mm were arranged within the vacuum chamber 220, the vacuum chamber was internally evacuated to $10^{-6}$ Torr and the aluminum substrate temperature was made 280° C. by the heater for heating substrate 212.

Then, $Si_2H_6$ gas from the $Si_2H_6$ bomb 201 at 300 sccm and $B_2H_6$/He gas mixture from the $B_2H_6$ bomb (diluted with He to 1000 ppm) 202 at 300 sccm were introduced through the gas introducing pipe 210 from the porous pipe 214 into the vacuum chamber 220, and $F_2$ gas from the $F_2$ bomb 203 at 300 sccm and He gas from the He bomb 204 at 1000 sccm through the gas introducing pipe 211 into the vacuum chamber 220. The vacuum valve 221 was controlled so that the inner pressure in the vacuum chamber 220 became 0.8 Torr at that time.

By permitting $Si_2H_6$, $F_2$ and $B_2H_6$ thus introduced to chemically react with each other, a first layer was formed on the aluminum cylinder to 3.0 $\mu$m.

After formation of the first layer, feeding of the $B_2H_6$/He gas mixture into the vacuum chamber was stopped, and the inner pressure within the vacuum chamber 220 was made 0.8 Torr by controlling the vacuum valve 221. And, a second layer was formed to 20.0 $\mu$m. Feeding of all the gases was stopped, and then the gaslines were well purged and the $B_2H_6$ bomb 202 was changed to $C_2H_4$ bomb 202. Thereafter, according to the same procedure as in formation of the first layer, by introducing $Si_2H_6$, $C_2H_4$, $F_2$ and He gases at 50 sccm, 300 sccm, 200 sccm and 1000 sccm, respectively, into the vacuum chamber 220, a third layer was formed to 0.5 $\mu$m.

An image forming member for electrophotography was formed as described above. When the electrophotographic characteristics of the image forming member for electrophotography were measured, the charging capacity was found to be improved by 10%, with the image defect being reduced by 30%, as compared with the image forming member of the prior art.

TABLE 2

| Layer constitution | Starting gas | Flow rate (SCCM) | Inner pressure | Film thickness ($\mu$m) |
|---|---|---|---|---|
| | | (Substrate temperature 280° C.) | | |
| First layer | $Si_2H_6$ | 300 | 0.8 | 3.0 |
| | $F_2$ | 300 | | |
| | He | 1000 | | |
| | $B_2H_6$/He = 1000 ppm | 300 | | |
| Second layer | $Si_2H_6$ | 300 | 0.8 | 20.0 |
| | $F_2$ | 300 | | |
| | He | 1000 | | |
| Third layer | $Si_2H_6$ | 50 | 0.8 | 0.5 |
| | $C_2H_4$ | 300 | | |
| | $F_2$ | 200 | | |
| | He | 1000 | | |

EXAMPLE 3

By use of the film forming device shown in FIG. 4, a deposited film was prepared according to the process of the present invention as described below.

$SiH_4$ gas filled in the bomb 401 was introduced at a flow rate of 20 sccm through the gas introducing pipe 409, and the $F_2$ gas diluted with He gas to 5% filled in the bomb 403 at a flow rate of 400 sccm through the gas introducing pipe 410 into the gas introducing port 411.

The pressure within the vacuum chamber 420 was made 800 mTorr by controlling the opening of the vacuum valve 419. As the substrate, a quartz glass (15 cm $\times$ 15 cm) was employed and the distance between the gas introducing port 411 and the substrate was set at 30 cm. At the inner portion of said gas introducing port 411, strong bluish white luminescence was observed. The substrate temperature (Ts) was set at between room temperature to 400° C. as shown in Table 3 for respective samples.

When gases were permitted to flow under such conditions for 30 minutes, an Si:H:F film with film thicknesses as shown in Table 3 was deposited on the substrate.

The distribution irregularity of the film thickness was within $\pm 5\%$. Every sample of the Si:H:F film formed was confirmed to be amorphous by electron beam diffraction.

On the amorphous Si:H:F film of each sample, a comb-shaped electrode (gap length 200 $\mu$m) of aluminum was vapor deposited to prepare a sample for measurement of electroconductivity. Each sample was placed in a vacuum cryostat, a voltage of 100 V was applied and the current was measured by a microamperemeter (YHP4140B) to determine the dark electroconductivity ($\sigma d$). Also, light of 600 nm and 0.3 mw/cm$^2$ was irradiated to determine the photoconductivity ($\sigma p$). Further, using a sample prepared separately, the optical band gap (Eg opt) was determined from absorption of light. These results are shown in Table 3.

TABLE 3

| Sample No. | 3-1 | 3-2 | 3-3 | 3-4 | 3-5 |
|---|---|---|---|---|---|
| Substrate temperature (°C.) | 28 | 120 | 200 | 300 | 400 |
| Film thickness ($\mu$m) | 2.1 | 1.9 | 1.8 | 1.6 | 1.5 |
| $\sigma d$ (s/cm) | $3 \times 10^{-11}$ | $4 \times 10^{-11}$ | $6 \times 10^{-11}$ | $8 \times 10^{-11}$ | $3 \times 10^{-11}$ |
| $\sigma p$ (s/cm) | $7 \times 10^{-7}$ | $9 \times 10^{-7}$ | $3 \times 10^{-6}$ | $4 \times 10^{-6}$ | $2 \times 10^{-6}$ |
| Eg opt (eV) | 1.70 | 1.65 | 1.65 | 1.60 | 1.55 |

EXAMPLE 4

In place of the gas introducing port shown in FIG. 5, the gas introducing port 611 shown in FIGS. 6A and 6B was employed. The above gas introducing port 611 consists of an inner pipe 611a connected to said gas introducing pipe 409, an outer pipe 611b connected to said gas introducing pipe 410 and a gas releasing direction controlling portion 611c in contact with the inner wall of said outer pipe 611b and the end portion of said inner pipe 611a. Thus, the gas introduced through said gas introducing pipe 410 into the space sandwiched between, the outer pipe 611b and the inner pipe 611a of the gas introducing port 611 is changed in its flow direction by said gas releasing direction control portion so as to pass along the circumference of said inner pipe 611a to be mixed uniformly and efficiently with the gas introduced through the gas introducing pipe 409 into the inner portion of the inner pipe 611a of the gas releasing section.

When film formation was performed under the same condition as in Example 3 by use of the gas introducing port 611 shown in FIGS. 6A and 6B, each sample of the Si:H:F films formed was confirmed to be amorphous by electron beam diffraction.

On the amorphous Si:H:F film of each sample, a comb-shaped electrode (gap length 200 $\mu$m) of aluminum was vapor deposited to prepare a sample for measurement of electroconductivity. Each sample was placed in a vacuum cryostat, a voltage of 100 V was applied and the current was measured by a microamperemeter (YHP4140B) to determine the dark electroconductivity ($\sigma d$). Also, light of 600 nm and 0.3 mw/cm² was irradiated to determine the photoconductivity ($\sigma p$). Further, using a sample prepared separately, the optical band gap (Eg opt) was determined from absorption of light. These results are shown in Table 4.

TABLE 4

| Sample No. | 4-1 | 4-2 | 4-3 | 4-4 | 4-5 |
|---|---|---|---|---|---|
| Substrate temperature (°C.) | 28 | 120 | 200 | 300 | 400 |
| Film thickness ($\mu$m) | 2.5 | 2.2 | 1.9 | 1.5 | 1.4 |
| $\sigma d$ (s/cm) | $3 \times 10^{-11}$ | $4 \times 10^{-11}$ | $6 \times 10^{-11}$ | $8 \times 10^{-11}$ | $3 \times 10^{-9}$ |
| $\sigma p$ (s/cm) | $8 \times 10^{-7}$ | $9 \times 10^{-7}$ | $4 \times 10^{-6}$ | $5 \times 10^{-6}$ | $3 \times 10^{-6}$ |
| Eg opt (eV) | 1.72 | 1.67 | 1.66 | 1.62 | 1.55 |

EXAMPLE 5

Figure 7A:
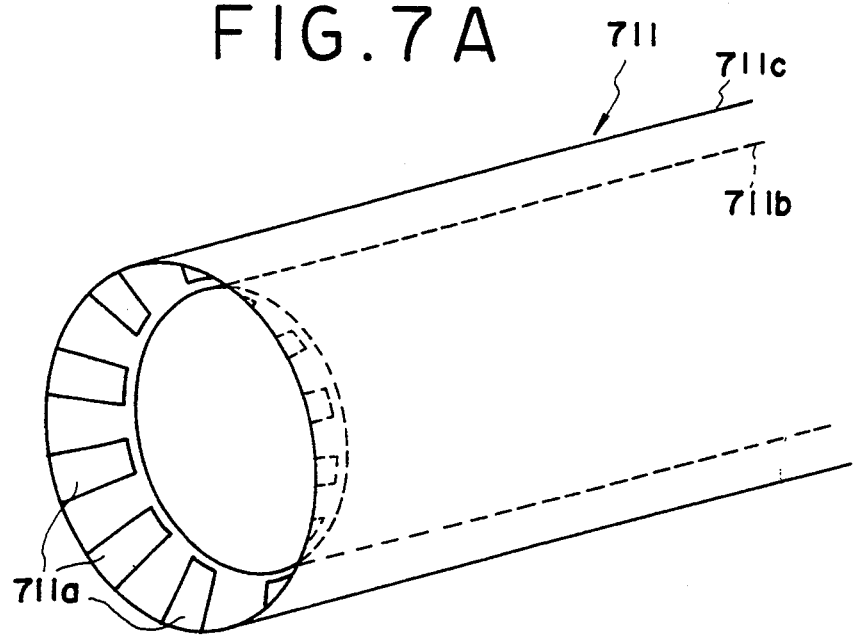
Figure 7B:
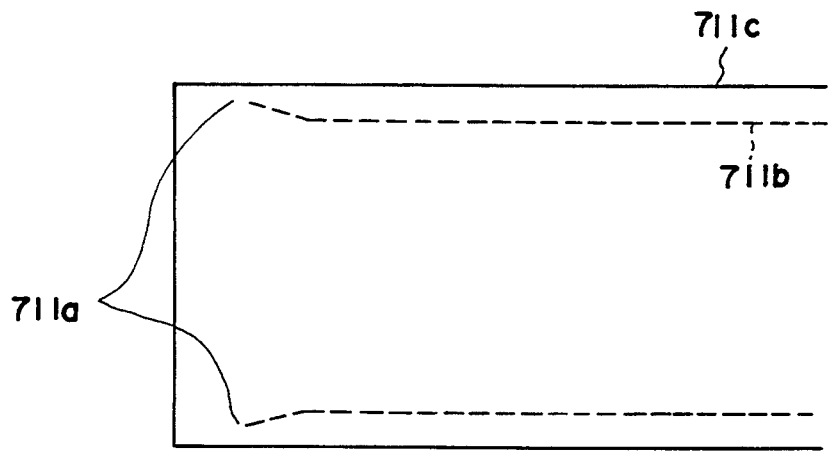

In the device for forming deposited film shown in FIG. 4, the gas introducing port 711 schematically shown in FIGS. 7A and 7B is employed. The above gas introducing port 711 consists of an inner pipe 711b connected to said gas introducing pipe 409 and having a hole 711a and an outer pipe 711c connected to the gas introducing pipe 410. Thus, the gas introduced through said gas introducing pipe 410 into the space sandwiched between the outer pipe 711c and the inner pipe 711b of the gas introducing port 711 is released from the hole 711a provided at the end portion of said inner pipe 711b and changed in its flow direction so as to flow toward the center axis of said inner pipe 711b from the outside of the gas introducing port 711 to be mixed uniformly and efficiently with the gas introduced through the gas introducing pipe 409 into the inner portion of the inner pipe 711b of the gas introducing port 711 primarily in the space outside of said gas introducing port 711.

When film formation was performed by use of the gas introducing port 711 shown in FIGS. 7A and 7B, each sample of the Si:H:F films formed was confirmed to be amorphous by electron beam diffraction.

On the amorphous Si:H:F film of each sample, a comb-shaped electrode (gap length 200 $\mu$m) of aluminum was vapor deposited to prepare a sample for measurement of electroconductivity. Each sample was placed in a vacuum cryostat, a voltage of 100 V was applied and the current was measured by a microamperemeter (YHP4140B) to determine the dark electroconductivity ($\sigma d$). Also light of 600 nm and 0.3 mw/cm² was irradiated to determine the photoconductivity ($\sigma p$). Further, from absorption of light, the optical band gap (Eg opt) was determined. These results are shown in Table 5.

TABLE 5

| Sample No. | 5-1 | 5-2 | 5-3 | 5-4 | 5-5 |
|---|---|---|---|---|---|
| Substrate temperature (°C.) | 28 | 120 | 200 | 300 | 400 |
| Film thickness ($\mu$m) | 2.4 | 2.3 | 2.0 | 1.4 | 1.4 |
| $\sigma d$ (s/cm) | $2 \times 10^{-11}$ | $3 \times 10^{-11}$ | $7 \times 10^{-11}$ | $9 \times 10^{-11}$ | $5 \times 10^{-9}$ |
| $\sigma p$ (s/cm) | $6 \times 10^{-7}$ | $4 \times 10^{-7}$ | $4 \times 10^{-6}$ | $6 \times 10^{-6}$ | $3 \times 10^{-6}$ |
| Eg opt (eV) | 1.8 | 1.72 | 1.69 | 1.58 | 1.49 |

We claim:

1. A device for introducing a mixture of gaseous starting material for the formation of a deposited film and a gaseous halogenic oxidizing agent having the property of oxidation action on said starting material into a reaction space to thereby form a gaseous mixture and produce a deposited film on a plurality of cylindrical substrates in said reaction space, comprising:

a plurality of coaxially aligned conduits for transporting the gaseous starting material and the gaseous oxidizing agent, said plurality of conduits including an outer conduit and at least one inner conduit having a side wall, at least one of said plurality of conduits having an opening to supply said gaseous starting material or said gaseous halogenic oxidizing agent toward the substrates in the reaction space; and a plurality of means for holding and rotating the substrates arranged concentrically around the plurality of coaxially aligned conduits the plurality of coaxially aligned conduits being located at the center of the plurality of means for holding and rotating the substrates, said means not only holding the substrates but also rotating the substrates wherein the distance between said substrates and said opening is several mm to 20 cm;

wherein at least one inner conduit includes at least one radially extending aperture in said side wall for permitting gas in said inner conduit and gas in an adjacent conduit to communicate, wherein upon communication, the gaseous mixture formed effects formation of the deposited film on said substrates; and wherein a diameter of said inner conduit is 0.1–50 mm, a diameter of said outer conduit is 0.2–60 mm, and said gaseous starting material is selected from the group consisting of straight chain silane compounds of the formula $Si_nH_{2n+2}$ where $n=1-8$, branched chain silane compounds $SiH_3SiH(SiH_3)SiH_2SiH_3$, cyclic silane compounds of the formula $Si_nH_{2n}$ wherein $n=3-6$ and chain germanium compounds of the formula $Ge_mH_{2m+2}$ where $m=1-5$.

2. The device of claim 1 wherein said at least one aperture is a slit.

3. The device of claim 1, wherein said inner conduit is a porous pipe.

4. The device of claim 1, wherein the diameter of said inner conduit is 0.3–20 mm.

5. The device of claim 1, wherein the diameter of said outer conduit is 0.3–40 mm.

6. The device of claim 5, wherein the diameter of said outer conduit is 0.4–30 mm.

7. The device of claim 1, wherein said conduits are formed of a material selected from the group consisting of metals, ceramics, resins and composite materials thereof.

8. The device of claim 7, wherein said metal is selected from the group consisting of stainless steel, Al, Cr, Mo, Au, Pt, Nb, Ta, V, Ti, Fe, Pd and Ni—Cr.

9. The device of claim 7, wherein said resin is selected from the group consisting of polyester, polyethylene, polycarbonate, cellulose acetate, polypropylene, polyvinyl chloride, polyvinylidene chloride, polystyrene and polyamide.

10. The device of claim 7, wherein said ceramic is selected from the group consisting of $Al_2O_3$, $SiO_2$, MgO, $SrO_2$, SiC, TiC, ZrC, BN, AlN, and $Si_3N_4$.

11. The device of claim 1, wherein the distance between said substrate and said opening is 5 mm to 15 cm.

12. The device of claim 1, wherein said gaseous halogenic oxidizing agent is selected from the group consisting of $F_2$, $Cl_2$, $Br_2$ and $I_2$.

13. The device of claim 1, wherein said aperture is provided in a plural number.

14. A device for introducing a mixture of a gaseous starting material for the formation of a deposited film and a gaseous halogenic oxidizing agent having the property of oxidation action on said starting material into a reaction space to thereby form a gaseous mixture and produce a deposited film on a plurality of cylindrical substrates in said reaction space, comprising:

a plurality of coaxially aligned conduits for transporting the gaseous starting material and the gaseous halogenic oxidizing agent, said plurality of conduits including an outer conduit and at least one inner conduit, at least one of said plurality of conduits having an opening to supply said gaseous starting material or said gaseous halogenic oxidizing agent toward the substrates in the reaction space; and a plurality of means for holding and rotating the substrates arranged concentrically around the plurality of coaxially aligned conduits the plurality of coaxially aligned conduits being located at the center of the plurality of means for holding and rotating the substrates, said means not only holding the substrate but also rotating the substrates wherein the distance between said substrates and said opening is several mm to 20 cm;

a means including at least one aperture for gas direction control at the terminal end of said coaxially aligned conduits and positioned between said inner conduit and said outer conduit so as to direct the gas flow conducted by said outer conduit toward said inner conduit;

wherein a diameter of said inner conduit is 0.1–50 mm, a diameter of said outer conduit is 0.2–60 mm, and said gaseous starting material is selected from the group consisting of straight chain silane compounds of the formula $Si_nH_{2n+2}$ where n=1–8, branched chain silane compounds $SiH_3SiH(SiH_3)SiH_2SiH_3$, cyclic silane compounds of the formula $Si_nH_{2n}$ wherein n=3–6 and chain germanium compounds of the formula $Ge_mH_{2m+2}$ where m=1–5.

15. The device of claim 14, wherein said means for gas direction control blocks the space between said inner conduit and outer conduit.

16. The device of claim 14, wherein said inner conduit is a porous pipe.

17. The device of claim 14, wherein the diameter of said inner conduit is 0.3–20 mm.

18. The device of claim 14, wherein the diameter of said outer conduit is 0.2–60 mm.

19. The device of claim 14, wherein the diameter of said outer conduit is 0.3–40 mm.

20. The device of claim 19, wherein the diameter of said outer conduit is 0.4–30 mm.

21. The device of claim 14, wherein said conduits are formed of a material selected from the group consisting of metals, ceramics, resins and composite materials thereof.

22. The device of claim 21, wherein said metal is selected from the group consisting of stainless steel, Al, Cr, Mo, Au, Pt, Nb, Ta, V, Ti, Fe, Pd and Ni—Cr.

23. The device of claim 21, wherein said resin is selected from the group consisting of polyester, polyethylene, polycarbonate, cellulose acetate, polypropylene, polyvinyl chloride, polyvinylidene chloride, polystyrene and polyamide.

24. The device of claim 21, wherein said ceramic is selected from the group consisting of $Al_2O_3$, $SiO_2$, MgO, $ZrO_2$ SiC, TiC, ZrC, BN, AlN and $Si_3N_4$.

25. The device of claim 14, wherein the distance between said substrate and said opening is 5 mm to 15 cm.

26. The device of claim 14, wherein said gaseous halogenic oxidizing agent is selected from the group consisting of $F_2$, $Cl_2$, $Br_2$, and $I_2$.

* * * * *

UNITED STATES PATENT AND TRADEMARK OFFICE
CERTIFICATE OF CORRECTION

PATENT NO. : 5,391,232
DATED : February 21, 1995
INVENTORS : MASAHIRO KANAI ET AL.

It is certified that error appears in the above-identified patent and that said Letters Patent is hereby corrected as shown below:

ON THE TITLE PAGE

At [56] References Cited

Under "U.S. PATENT DOCUMENTS"

"4,637,938 11/1987 Lee" should read
--4,637,938 1/1987 Lee--.

Under "OTHER PUBLICATIONS"

"p. 74." should read --p. 774.--.

COLUMN 3

Line 9, "10" should be deleted.

COLUMN 4

Line 37, "Further" should read --A further--.
Line 40, "linesensor" should read --line sensor--.
Line 41, "imput," should read --input,--.
Line 43, "Still" should read --A still--.

COLUMN 6

Line 68, "limited" should read --limited.--.

UNITED STATES PATENT AND TRADEMARK OFFICE
CERTIFICATE OF CORRECTION

PATENT NO. : 5,391,232

DATED : February 21, 1995

INVENTORS : MASAHIRO KANAI ET AL.      Page 2 of 3

It is certified that error appears in the above-identified patent and that said Letters Patent is hereby corrected as shown below:

COLUMN 9

Line 19, "a" should read --an--.
Line 38, "a" should be deleted.

COLUMN 12

Line 23, "was" should read --were--.
Line 39, "determine" should read --to determine--.
Line 60, "EXAMPLE 3" should read --EXAMPLE 2--.

COLUMN 17

Line 35, "substrate" should read --substrates--.

UNITED STATES PATENT AND TRADEMARK OFFICE
CERTIFICATE OF CORRECTION

PATENT NO. : 5,391,232

DATED : February 21, 1995

INVENTORS : MASAHIRO KANAI ET AL.

It is certified that error appears in the above-identified patent and that said Letters Patent is hereby corrected as shown below:

<u>COLUMN 18</u>

Please delete lines 17 and 18.

Signed and Sealed this

Thirteenth Day of June, 1995

Attest:

BRUCE LEHMAN

Attesting Officer

Commissioner of Patents and Trademarks